(12) United States Patent
Teneze

(10) Patent No.: US 11,391,813 B2
(45) Date of Patent: Jul. 19, 2022

(54) METHOD FOR DETECTING RADAR SIGNALS

(71) Applicant: AVANTIX, Aix en Provence (FR)

(72) Inventor: Bernard Teneze, La Roque d'Antheron (FR)

(73) Assignee: AVANTIX, Aix-en-Provence (FR)

( * ) Notice: Subject to any disclaimer, the term of this patent is extended or adjusted under 35 U.S.C. 154(b) by 158 days.

(21) Appl. No.: 16/754,947

(22) PCT Filed: Oct. 9, 2018

(86) PCT No.: PCT/EP2018/077462
§ 371 (c)(1),
(2) Date: Apr. 9, 2020

(87) PCT Pub. No.: WO2019/072838
PCT Pub. Date: Apr. 18, 2019

(65) Prior Publication Data
US 2020/0233058 A1 Jul. 23, 2020

(51) Int. Cl.
*G01S 7/292* (2006.01)
*G01R 23/16* (2006.01)
(Continued)

(52) U.S. Cl.
CPC ............ *G01S 7/2927* (2013.01); *G01R 23/16* (2013.01); *G01S 7/021* (2013.01); *G01S 7/356* (2021.05)

(58) Field of Classification Search
CPC ......... G01R 23/16; G01S 7/021; G01S 7/292; G01S 7/2927; G01S 7/356
See application file for complete search history.

(56) References Cited

U.S. PATENT DOCUMENTS

2001/0040525 A1 11/2001 Springer et al.
2002/0159516 A1* 10/2002 Baker ................ H04L 1/0006
375/240
(Continued)

FOREIGN PATENT DOCUMENTS

CN 101504638 A 8/2009

OTHER PUBLICATIONS

James Tsui, "Multiple Fast Fourier Transform Electronic Warfare Receiver", Publication date Dec. 2015 (Year: 2015).*
(Continued)

*Primary Examiner* — Timothy X Pham
(74) *Attorney, Agent, or Firm* — Arc IP Law, PC; Joseph J. Mayo

(57) ABSTRACT

The present invention concerns a method for processing radar signals in a detection system comprising at least one computing architecture comprising at least one memory to store at least one set of signal-related programs and/or data, at least one processor executing said programs to implement said method comprising at least a first step (E1) to digitize radar signals, a second step to generate spectra from the digitized signals obtained at the first step (E1), via FFT computation, said method being characterized in that FFT computation at the spectra generation step (E2) comprises at least one multi-FFT processing comprising at least: simultaneous FFT computation (E20) of different sizes with automatic selection of said sizes and real-time selection of signals (E21) in all the spectra of the different FFT computations, via a selection algorithm.

11 Claims, 1 Drawing Sheet

Figure 1A:
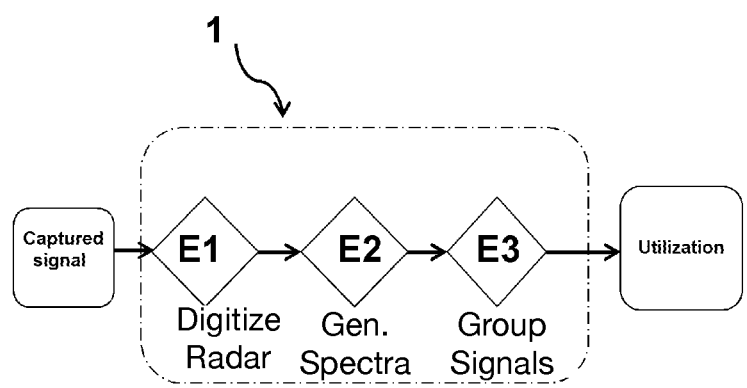

(51) Int. Cl.
*G01S 7/02* (2006.01)
*G01S 7/35* (2006.01)

(56) References Cited

U.S. PATENT DOCUMENTS

| 2014/0253361 | A1 | 9/2014 | Rezk et al. | |
|---|---|---|---|---|
| 2014/0375491 | A1* | 12/2014 | Roger | G01S 7/288 |
| | | | | 342/93 |
| 2016/0131743 | A1* | 5/2016 | Addison | G01S 7/414 |
| | | | | 342/196 |
| 2017/0269192 | A1* | 9/2017 | Hode | G01S 7/292 |

OTHER PUBLICATIONS

Cheng et al., C.H., "Electronic Warfare Receiver with Multiple FFT Frame Sizes," IEEE Transactions On Aerospace and Electronic Systems, IEEE Service Center, Piscataway, NJ, US, vol. 48, No. 4, Oct. 1, 2012, pp. 3318-3330.

International Search Report from corresponding International Application No. PCT/EP2018/077462, dated Jan. 23, 2019, pp. 1-6, European Patent Office, Rijswijk, The Netherlands.

Written Opinion from corresponding International Application No. PCT/EP2018/077462, pp. 1-6, European Patent Office, Rijswijk, The Netherlands.

\* cited by examiner

METHOD FOR DETECTING RADAR SIGNALS

RELATED APPLICATIONS

The present application is a National Phase of International Application Number PCT/EP2018/077462, filed Oct. 9, 2018, and claims priority to French Application No. 1759454, filed Oct. 10, 2017.

TECHNICAL FIELD OF THE INVENTION

The present invention relates to the field of signal and/or image detection and processing, more specifically the invention concerns a method for processing radar signals or pulses.

TECHNOLOGICAL BACKGROUND OF THE INVENTION

Radar signal processing comprises a set of techniques and analysis methods applied from the time of receiving signals up to interpretation of the data contained in said signals. Proper interpretation of said data is therefore partly dependent upon the methods applied to process said signals, in particular the fast Fourier Transform method. (FFT).

There are numerous devices and algorithms allowing implementation of FTT computation for the detection of radar signals.

Nonetheless, these devices and/or algorithms are not often adapted to the large variety of signals that can be received by radars, and are therefore less efficient for the real-time detection for example of a target or object.

GENERAL DESCRIPTION OF THE INVENTION

The aim of the present invention is to overcome some of the drawbacks of the prior art by proposing a method for real-time processing of radar signals.

This aim is reached with a method for processing radar signals in a detection system comprising at least a computing architecture comprising at least one memory to store at least one set of signal-related programs and/or data, at least one processor executing said programs to implement said method comprising at least:
- a first step (E1) to digitize radar signals by means of a digitization device;
- a second step (E2) to generate spectra from the digitized signals obtained at the first step (E1), via FFT computation;

said method being characterized in that FFT computation at the spectra generation step (E2) comprises at least a multi-FFT processing comprising at least:
- simultaneous FFT computation (E20) of different sizes with automatic selection of said sizes via a selection algorithm, from among the sizes stored in memory;
- real-time selection of signals (E21) in all the spectra resulting from the different FFT computations, performed via a selection algorithm.

According to another feature, the FFT computation (E20) of different sizes with automatic size selection comprises the simultaneous execution of different sub-programs each comprising an FFT algorithm of specific size.

According to another feature, the different FFT computations are weighted by a Chebyshev window, said window allowing the breakdown into small parts of detected signals which do not result from an FFT computation performed with the adapted FFT size.

According to another feature, in the simultaneous FFT computation (E20), the different signal detection thresholds associated with the different FFT sizes used and placed in increasing order in the memory, are separated by a constant value of between 4 dB and 10 dB.

According to another feature, at the real-time signal selection step (E21), execution of the selection algorithm allows implementation of at least one of the following steps:
- delimiting a rectangular zone around each detected signal of the spectrum, obtained for each size used in FFT computation;
- superimposing said zones taking into account the time and frequency details of each of the FFT sizes used in FFT computation;
- selecting signals per zone in accordance with at least one predefined criterion stored in memory and relating to the duration of said signals.

According to another feature, at the selection step per zone, if at least two superimposed zones overlap, at least one of the following steps is carried out:
- comparing the duration of the signals contained in each of the zones, each duration being compared with a memorized threshold dependent upon the FFT size used for FFT computation;
- for a given FFT size, if the duration of a signal is longer than the memorized threshold value corresponding to said size selected by the program, then said signal is retained and memorized, and the other signals contained in these said zones and corresponding to different FFT sizes, are removed from the memory.

According to another feature, the method also comprises a step (E3) to group together signals selected per zone on one same spectrum, to form a multi-FFT spectrum.

Another aim of the present invention is to propose an infrastructure for the detection of radar signals or pulses.

This aim is reached with a system for detecting radar signals comprising at least one radar signal digitization device, a computing and hardware architecture comprising at least one memory to record digitized signals, said system being characterized in that the memory also memorizes sizes and threshold values, and the computing and hardware architecture also comprises at least one radar signal combining module, at least one processor executing a program stored in said memory to implement the steps of the method for processing radar signals.

According to another feature, the signal combining module allows the grouping together of all detected signals, via FFT computations of different sizes, on one same spectrum.

DESCRIPTION OF ILLUSTRATIVE FIGURES

Figure 1B:
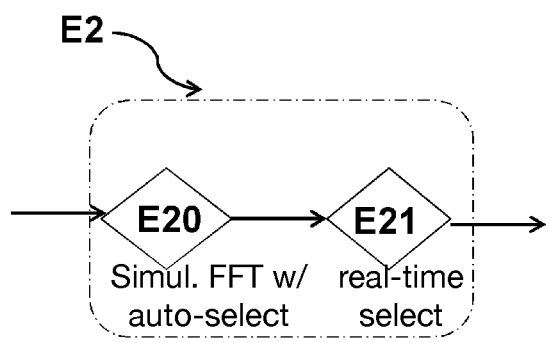

Other features and advantages of the present invention will become better apparent on reading the following description given with reference to the appended drawings in which:

FIGS. 1a and 1b respectively illustrate the different steps of radar signal processing and the sub-steps of the spectra generation step, in one embodiment.

DESCRIPTION OF PREFERRED EMBODIMENTS OF THE INVENTION

The present invention concerns a method for processing radar signals for the detection of objects.

In some embodiments, the method (1, FIG. 1a) for processing radar signals in a detection system comprises at least a computing architecture comprising at least one memory to store at least one set of signal-related programs and/or data, at least one processor executing said programs to implement said method (1) comprising at least:
  a first step (E1) to digitize radar signals by means of a digitization device;
  a second step (E2) to generate spectra from the digitized signals obtained at the first step (E1), via FFT computation;
said method (1) being characterized in that FFT computation at the spectra generation step (E2, FIGS. 1a, 1b) comprises at least a multi-FFT processing comprising at least:
  simultaneous FFT computation (E20, FIG. 1b) of different sizes with automatic selection of said sizes;
  real-time selection (E21, FIG. 1b) of signals detected in all the spectra of the different FFT computations, via a selection algorithm.

The method thus described can enable the detection system to self-adapt to the highly varying nature of the different parameters of a radar signal or pulse. The parameters of a radar pulse comprise at least:
  the duration of the pulse;
  modulation (linear modulation of frequency);
  the level, and in particular very low levels;
  frequency juxtaposition between pulses;
  time proximity between pulses.

Radar is a system using radio waves as analogue signals or pulses, for detection and determination of the distance and/or velocity of objects or targets such as motor vehicles, aircraft, ships etc. In general, radar comprises an emitting device sending signals or pulses which are reflected by the object or target, and an intercepting or receiving device which captures or receives said signals.

The electromagnetic spectrum used by most radars of interest is covered by a frequency band in the range of 500 MHz to 18 GHz. An antenna (or several antennae adapted to this broad band), followed by an amplifier and receiver allow a so-called intermediate frequency (IF) signal to be produced which represents a sub-band of this overall spectrum.

After reception, by said intercepting device, of the reflected analogue signal(s), said signals are transmitted to a digitization device e.g. but not limited thereto a digital spectrum analyzer or analogue-to-digital converter (ADC). The converting of an analogue signal, which contains a continuous set of physical data able to take on an infinity of different values, to a digital signal which contains a discrete set of physical data with a finite number of values, is generally accompanied by loss of data as a function of the size of the FFT computation (Fast Fourier Transform) used to analyze the signal.

In general, the method used to detect a radar pulse entails applying the Fourier Transform to a digitized radiofrequency signal. The radiofrequency signal is the signal captured by an antenna, that is amplified then transposed around a given IF (intermediate frequency) and given bandwidth (e.g. 500 MHz).

Digitization of the radar signal first requires sampling of said signal. For sampling, the values of a signal are recorded at defined intervals and a sequence of discrete values is produced. The series of values is used for FFT computation to obtain an FFT spectrum of the signal that will be analyzed to interpret the data contained in said signal. By size of FFT computation, it is meant the number of points used in the sampling of the reflected radar signal.

To process an instantaneous band, the ADC must have a sampling frequency of at least twice the frequency of the bandwidth (Shannon theorem). For example, but not limited thereto, to process the instantaneous band of 500 MHz, the sampling frequency of the ADC must be about 1.28 GHz.

In addition to sampling frequency and/or the signal analysis time window or weighting window, which are parameters of importance for digitization and FFT computation, the size of said FFT computation (number of points used for sampling) also plays a predominant role in obtaining the spectrum of said signal and interpretation thereof. The choice of FFT computation size can have an impact on the detection process. In general, radar emits signals at regular intervals separated by a period called «pulse repetition interval» (PRI). Its inverse is «pulse repetition frequency» (PRF). «PRI» or «PRF» determine the overall functioning of a radar and allow a distinction to be made between several types of radars, for example low pulse repetition frequency radars (low PRFs) of about 1 kHz to 10 kHz which calculate the distance of a target from the time delay of echoes, and high pulse repetition frequency radars (high PRFs) of about 100 kHz to 250 kHz which detect targets from the velocities thereof rather than using distance. In addition to PRI which determines the overall functioning of a radar, «pulse width» (PW) allows determination of some operating characteristics of a radar, in particular bandwidth and distance resolution. PW is the time during which the radar emits a pulse. The size of FFT computation can therefore be adapted accordingly to the detection of some types of signal as a function of the pulse repetition interval (PRI) and/or pulse width (PW). A radar signal or pulse having a very short repetition frequency (PRF) for example will necessitate the choice of a very large number of points or a larger size in the sampling phase of the analogue signal, for FFT processing, unlike a radar signal having a long repetition frequency which will necessitate the choice of a smaller number of points to describe the signal, hence a smaller size. If the size or number of points chosen for sampling is not adapted to the description of the radar signal, it is possible that this signal may not be detected. For example, but not limited thereto, the sizes used are 64, 128, 256, 512, 1024, 2048 and 4096. For example, but not limited thereto, an FFT size of 64 points is adapted to the detection of very short pulses, and pulses that are very close in time, and to pulses with very fast chirp modulation.

By chirp, it is meant a radar pulse having linear frequency modulation.

A chirp is generally a complex signal having the form $x(t)=a(t) \exp\{i\varphi(t)\}$, where $a(t) \geq 0$ is a low-pass amplitude which progresses slowly compared with phase oscillations $\varphi(t)$.

An FFT size of 1024 points is adapted to the detection of very weak pulses (low energy) and pulses that are simultaneous in time and of close frequency. Finally, an FFT size of 256 points is the compromise between the preceding sizes.

In general, the three FFT sizes 64, 256 et 1024 are the best adapted for covering all encountered radar pulses, and evidently also depend on the sampling frequency of the above-mentioned ADC, i.e. 1.28 GHz. Preferably, the sizes 64, 256 et 1024 are chosen for the detection of radar signals or pulses.

In addition to PRI and PW, other parameters can be taken into account for the choice of FFT computation size of the radar signal, for example but not limited thereto the rate of variation in pulse frequency, signal-to-noise ratio, etc. An inadequate size can induce noise in the result of FFT computation of the reflected signal, thereby preventing detection thereof. The automatic taking into account of several sizes in FFT computation with selection of the best signals therefore allows increased probability of radar signal detection.

The detection method allows permanent, real-time analysis of a given instantaneous band, for example but not limited thereto an instantaneous band of 500 MHz, to identify therein any radar pulses. Fast Fourier Transforms (FFT) are performed in real-time and continuously on said instantaneous band. The presence of energy in the frequency bins of the FFT is tracked from FFT to FFT to detect therein the presence of radar pulses. One difficulty concerns the choice of proper size of FFT computation. There is no one-size allowing the capture of all radar pulses. With the method of the present invention, it is possible to overcome this restriction.

In some embodiments, the simultaneous FFT computation (E20) of different sizes with automatic size selection, comprises the simultaneous execution of different sub-programs each comprising an FFT algorithm of specific size. The processing of radar signals via FFT computation is generally performed with manual selection of sampling size.

In the automatic processing of the present invention, multi-FFT processing or computation comprises at least the implementation of several sub-programs in a computing and hardware architecture comprising at least one processor and at least one storage memory. Preferably, the hardware architecture is a Field Programmable Gate Array (FPGA), for example of virtex 7 type or Ultrascale by Xilinx which is a multiprocessor programmable logic circuit allowing implementation simultaneously or in parallel of FFT computations of different sizes. The FFT spectra resulting from computations are stored in said storage memory. Each spectrum obtained is a representation of the amplitudes of the different spectral components of the radar signal as a function of frequency. To visualize spectrum changes as a function of time, a time/frequency diagram is plotted in which each colour used for the spectrum indicates the intensity of a spectral component. Time is given along the X-axis and frequency along the Y-axis. A different colour is associated with each intensity.

After obtaining the spectra, the selection algorithm is automatically executed on the processor of the computing and hardware architecture, to implement the selection of spectral components of the radar signal.

In some embodiments, the weighting window used in the different FFT computations is preferably a Chebyshev window, said window allowing the breakdown into small parts of those detected signals which do not result from an FFT computation performed with the adapted FFT size.

In some embodiments, before selection of the detected radar signals or pulses at the simultaneous FFT computation step (E20), the different signal detection thresholds, for the different FFT sizes used and placed in increasing order, are separated by a constant value of between 4 dB and 10 dB. Preferably, a constant value of 6 dB is chosen.

For example, but not limited thereto, the detection threshold for FFT computation of size T=256 is adjusted to 6 dB lower than that of the FFT computation of size 64, and the detection threshold for FFT computation of size T=1024 is adjusted to 6 dB lower than that of the FFT computation of size 256.

A different detection threshold S is associated with each size. S for T=64; S−6 dB for T=256; and S−12 dB for T=1024. All the thresholds associated with the defined sizes are stored in memory for use by the detection algorithm.

In some embodiments, at the real-time signal selection step (E21), execution of the selection algorithm allows implementation of at least the delimiting of at least one rectangular zone around each detected signal of the spectrum obtained for each size used in FFT computation, and optionally:

superimposing said zones taking into account the time and frequency details of each of the FFT sizes used in FFT computation;

and/or selecting signals zone-by-zone in accordance with at least one memorized, predefined criterion relating to the duration of said signals.

In some embodiments, at the selection step per zone, if at least two superimposed zones overlap, at least one of the following steps is carried out:

comparing the duration of the signals contained in each zone, each duration being compared with a memorized threshold dependent upon the FFT size used for FFT computation;

for a given FFT size, if the duration of a signal is longer than the memorized threshold value corresponding to said size, then said signal is retained in memory and the other signals contained in these said zones corresponding to different FFT sizes, are removed from the memory.

For example, but not limited thereto, the threshold value used for the selection of signals in the different zones can be the minimum value $PW_{min}$ of the pulse width PW. Therefore, the algorithm at the time of selection e.g. in two zones which overlap, but not limited thereto, performs the following operations:

comparing the duration of a signal with each value $PW_{min}$ of the FFT sizes used (e.g. 64, 256 and 1024); and if the duration of a signal is longer than the $PW_{min}$ of size 1024, then the retained signal or pulse is the one detected by FFT computation of size 1024, and all the other signals detected in these zones by the other FFT computations of different size (256 and 64) are removed from the memory;

otherwise, if the duration is longer than the $PW_{min}$ of size 256, then the retained pulse is the one detected by FFT computation of size 256, and all the other products in these zones resulting from FFT 64 are removed;

otherwise, retaining of the pulses detected by FFT computation of size 64.

The detection method described in the foregoing also affords good results for improved frequency-separating and time-separating capabilities.

Frequency-separating capability is the ability to separate pulses of close frequency. The algorithm in the event of pulses with close frequency will naturally select the largest FFT size as a function of the duration of the pulses. Since the FFT of largest size has the best-performing frequency-separating capability, the final result will therefore be optimal.

Time-separating capability is the ability to separate pulses of same frequency that are close in time (the start of the following pulse is close to the preceding pulse). In other words, in radar specialist terms, the pulse repetition interval is short. However, radars having a low PRI are radars producing pulses of very short duration. In this case, the detection method will automatically select the smallest FFT size, i.e. FFT 64, for a so-called high-PRF radar (high pulse repetition frequency).

In some embodiments, the method also comprises a step (E3) to group together signals selected per zone on one same spectrum, to form a multi-FFT spectrum.

By spectrum or spectral image, it is meant an image resulting from the breakdown of a wave or signal after processing.

The present invention also concerns a system for the detection of radar signals.

In some embodiments, the system to detect radar signals comprises at least one radar signal digitization device, a computing and hardware architecture comprising at least one memory to record digitized signals, said system being characterized in that the computing and hardware architecture also comprises at least one radar signal combining module, at least one processor executing a program stored in said memory to implement the steps of the method (1) for processing radar signals.

The signal combining module of the radar signal detection system allows the grouping together of all detected signals, via FFT computations of different sizes, on one same spectrum.

By module, we mean a code executable by the processor of a computing device e.g. a computer.

The present application describes various techniques and advantages with reference to the Figures and/or to various embodiments. Persons skilled in the art will understand that the technical characteristics of a given embodiment can be combined with characteristics of another embodiment, unless the reverse is explicitly mentioned or unless it is obvious that these characteristics are incompatible or the combination thereof does not provide a solution to at least one of the technical problems mentioned in the present application. In addition, the technical characteristics described in a given embodiment can be isolated from the other characteristics of this embodiment unless the reverse is explicitly mentioned.

It will be obvious for skilled persons that the present invention allows embodiments under numerous other specific forms without departing from the field of application of the invention such as claimed. The present embodiments are therefore to be construed as an illustration but can be modified in the field defined by the requested protection, and the invention is not to be limited to the details given in the foregoing.

What is claimed is:

1. A method for processing radar signals in a detection system comprising at least a computing architecture including at least one memory to store at least one set of signal-related programs and/or data, at least one processor executing said at least one set of signal-related programs to implement said method, wherein said method comprises:
   digitizing said radar signals by means of a digitization device;
   generating spectra from the radar signals that are digitized, via FFT computation;
   wherein the FFT computation comprises at least a multi-FFT processing said multi-FFT processing comprising:
      simultaneous FFT computation of different FFT sizes, as different FFT computations, with automatic selection of said different FFT sizes via a selection algorithm, from among sizes stored in said at least one memory; and
      real-time selection of signals in all spectra resulting from the different FFT computations, performed via said selection algorithm;
   wherein in the simultaneous FFT computation, different signal detection thresholds associated with the different FFT sizes used and placed in increasing order in the at least one memory, are separated by a constant value of between 4 dB and 10 dB.

2. The method according to claim 1, wherein the simultaneous FFT computation of said different FFT sizes with said automatic selection of the different FFT sizes comprises simultaneous execution of different sub-programs each comprising an FFT algorithm of specific size.

3. The method according to claim 1, wherein the different FFT computations are weighted by a Chebyshev window, said Chebyshev window allowing a breakdown into small parts of detected signals which do not result from an FFT computation performed with an adapted FFT size of said different FFT sizes.

4. The method according to claim 1, wherein at said real-time selection of said signals, execution of the selection algorithm allows implementation of at least delimiting of at least one rectangular zone around each detected signal of a spectrum obtained for each size of said different FFT sizes used in said simultaneous FFT computation, and optionally one or more of:
   superimposing zones of said spectra taking into account time and frequency details of each FFT size of the different FFT sizes used in said FFT computation;
   selecting signals zone-by-zone in accordance with at least one memorized, predefined criterion relating to a duration of said signals.

5. The method according to claim 4, wherein at the selecting signals zone-by-zone, if at least two superimposed zones overlap, then said method further comprises at least one of:
   comparing the duration of the signals contained in each zone of the zones, each duration being compared with a memorized threshold value dependent upon an FFT size of the different FFT sizes used for the simultaneous FFT computation;
   for a given FFT size, if the duration of a signal of said signals is longer than the memorized threshold value corresponding to said FFT size that is selected by the at least one set of signal-related programs, then said signal is retained and memorized and other signals of said signals contained in said zones and corresponding to different FFT sizes are removed.

6. The method according to claim 1, further comprising grouping together signals selected per zone on one same spectrum, to form a multi-FFT spectrum.

7. A system for detecting radar signals comprising:
   at least one radar signal digitization device;
   a computing and hardware architecture comprising at least one memory to record digitized signals,
      wherein the at least one memory memorizes sizes and threshold values, and
      wherein the computing and hardware architecture further comprises at least one radar signal combining module;
   at least one processor executing a program stored in said at least one memory to implement a method for processing said radar signals in said system,
      wherein said method comprises
         digitizing said radar signals by means of said at least one radar signal digitization device;
         generating spectra from the radar signals that are digitized, via FFT computation;
         wherein the FFT computation comprises at least a multi-FFT processing, said multi-FFT processing comprising
            simultaneous FFT computation of different FFT sizes, as different FFT computations, with automatic selection of said different FFT sizes via a selection algorithm, from among said sizes stored in said at least one memory; and real-time selection of signals in all spectra resulting from the different FFT computations, performed via said selection algorithm;

wherein in the simultaneous FFT computation, different signal detection thresholds associated with the different FFT sizes used and placed in increasing order in the at least one memory, are separated by a constant value of between 4 dB and 10 dB.

8. The system according to claim 7, wherein the at least one radar signal combining module allows grouping together of all detected signals, via said different FFT computations of said different FFT sizes, on one same spectrum.

9. The system according to claim 7, wherein at said real-time selection of said signals, execution of the selection algorithm allows implementation of at least delimiting of at least one rectangular zone around each detected signal of a spectrum obtained for each size of said different FFT sizes used in said simultaneous FFT computation, and optionally one or more of:

superimposing zones of said spectra taking into account time and frequency details of each FFT size of the different FFT sizes used in said FFT computation;

selecting signals zone-by-zone in accordance with at least one memorized, predefined criterion relating to a duration of said signals.

10. The system according to claim 9, wherein at the selecting signals zone-by-zone, if at least two superimposed zones overlap, then said method further comprises at least one of:

comparing the duration of the signals contained in each zone of the zones, each duration being compared with a memorized threshold value dependent upon an FFT size of the different FFT sizes used for the simultaneous FFT computation;

for a given FFT size, if the duration of a signal of said signals is longer than the memorized threshold value corresponding to said FFT size that is selected by the program, then said signal is retained and memorized and other signals of said signals contained in said zones and corresponding to different FFT sizes are removed.

11. A method for processing radar signals in a detection system comprising at least a computing architecture including at least one memory to store at least one set of signal-related programs and/or data, at least one processor executing said at least one set of signal-related programs to implement said method, wherein said method comprises:

digitizing said radar signals by means of a digitization device;

generating spectra from the radar signals that are digitized, via FFT computation;

wherein the FFT computation comprises at least a multi-FFT processing, said multi-FFT processing comprising simultaneous FFT computation of different FFT sizes, as different FFT computations, with automatic selection of said different FFT sizes via a selection algorithm, from among sizes stored in said at least one memory; and real-time selection of signals in all spectra resulting from the different FFT computations, performed via said selection algorithm;

wherein at said real-time selection of said signals, execution of the selection algorithm allows implementation of at least delimiting of at least one rectangular zone around each detected signal of a spectrum obtained for each size of said different FFT sizes used in said simultaneous FFT computation, and optionally one or more of:

superimposing zones of said spectra taking into account time and frequency details of each FFT size of the different FFT sizes used in said FFT computation;

selecting signals zone-by-zone in accordance with at least one memorized, predefined criterion relating to a duration of said signals wherein at the selecting signals zone-by zone, if at least two superimposed zones overlap, then said method further comprises at least one of:

comparing the duration of the signals contained in each zone of the zones, each duration being compared with a memorized threshold value dependent upon an FFT size of the different FFT sizes used for the simultaneous FFT computation;

for a given FFT size, if the duration of a signal of said signals is longer than the memorized threshold value corresponding to said FFT size that is selected by the at least one set of signal-related programs, then said signal is retained and memorized and other signals of said signals contained in said zones and corresponding to different FFT sizes are removed.

* * * * *